(12) United States Patent
Adams et al.

(10) Patent No.: US 6,901,003 B2
(45) Date of Patent: May 31, 2005

(54) LOWER POWER AND REDUCED DEVICE SPLIT LOCAL AND CONTINUOUS BITLINE FOR DOMINO READ SRAMS

(75) Inventors: Chad Allen Adams, Byron, MN (US); Anthony Gus Aipperspach, Rochester, MN (US); Todd Alan Christensen, Rochester, MN (US); Peter Thomas Freiburger, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/616,847

(22) Filed: Jul. 10, 2003

(65) Prior Publication Data

US 2005/0007813 A1 Jan. 13, 2005

(51) Int. Cl.[7] .............................................. G11C 11/00
(52) U.S. Cl. ........................ 365/154; 365/201; 365/190
(58) Field of Search ................................ 365/154, 201, 365/190

(56) References Cited

U.S. PATENT DOCUMENTS 6,108,256 A * 8/2000 Schneider .................... 365/203
6,741,493 B1 * 5/2004 Christensen et al. ........ 365/154

* cited by examiner

*Primary Examiner*—Van Thu Nguyen
*Assistant Examiner*—Pho M. Luu
(74) *Attorney, Agent, or Firm*—Carr LLP; Robert M. Carwell

(57) ABSTRACT

A method, an apparatus, and a computer program are provided to reading indicia from an SRAM cell. A low value is generated on a write true line. A high value is generated on a continuous bit_line. The true node of the SRAM cell is evaluated through use of a floating voltage coupled to the true node of the SRAM cell. If the floating voltage stays substantially constant, the value read from the SRAM cell is a high. If the floating voltage is drained to ground, the value read from the SRAM cell is a low.

20 Claims, 2 Drawing Sheets

LOWER POWER AND REDUCED DEVICE SPLIT LOCAL AND CONTINUOUS BITLINE FOR DOMINO READ SRAMS

CROSS REFERENCE TO RELATED APPLICATION

The present application is related to U.S. patent application entitled "SPLIT LOCAL AND CONTINUOUS BITLINE FOR FAST DOMINO READ SRAM," Ser. No. 10/140,549 (attorney docket no. ROC820010594) filed May 7, 2002, and to U.S. patent application entitled "SPLIT LOCAL AND CONTINUOUS BITLINE REQUIRING FEWER WIRES", Ser. No. 10/289,804, filed Jul. 7, 2002.

TECHNICAL FIELD

The invention relates generally to static random access memory (SRAM) cells and, more particularly, to using a continuous bitline in conjunction with an SRAM cell.

BACKGROUND

SRAMs (static random access memories) are memory elements that store data in the form of complementary low voltage and high voltage at opposite sides of the SRAM. An SRAM, unlike dynamic random access memory (DRAM), maintains the memory value all of the time that power is applied to the circuit. This is unlike the DRAM, which is periodically refreshed with the value to be saved. If the "true" node is read as a high voltage, the value of the SRAM is one. If the true polarity node is read as a low voltage, the value of the SRAM is zero.

Within some SRAMs, there are individualized write true (WriteT) lines and write complementary (WriteC) lines that are used to write complementary values to the complementary polarity nodes inside. However, it was discovered that the separate WriteC bitline to each individual SRAM cell could be replaced by a continuous bit-line complementary (BLC) to all of the SRAMs cells along the same bitline. A bitline can generally be defined as a connection to a plurality of SRAM cells at a transfer gate.

However, as processing speeds increase and devices within integrated circuits become ever smaller, the complexity of the SRAM cell, and power consumption of the SRAM are of ever-increasing concern. Even though use of the continuous BLC line within an SRAM cell has reduced some of the complexity of the local evaluator, these issues are still of concern to chip designers.

Therefore, there is a need for an SRAM design that overcomes at least some of the issues associated with conventional SRAM design.

SUMMARY OF THE INVENTION

The present invention provides for reading indicia from an SRAM cell. A low value is generated on a write true line. A high value is generated on a continuous bit line. The true node of the SRAM cell is evaluated.

BRIEF DESCRIPTION OF THE DRAWINGS

For a more complete understanding of the present invention, and the advantages thereof, reference is now made to the following Detailed Description taken in conjunction with the accompanying drawings, in which.

DETAILED DESCRIPTION

In the following discussion, numerous specific details are set forth to provide a thorough understanding of the present invention. However, those skilled in the art will appreciate that the present invention may be practiced without such specific details. In other instances, well-known elements have been illustrated in schematic or block diagram form in order not to obscure the present invention in unnecessary detail. Additionally, for the most part, details concerning network communications, electromagnetic signaling techniques, and the like, have been omitted inasmuch as such details are not considered necessary to obtain a complete understanding of the present invention, and are considered to be within the understanding of persons of ordinary skill in the relevant art.

It is further noted that, unless indicated otherwise, all functions described herein may be performed in either hardware or software, or some combination thereof. In a preferred embodiment, however, the functions are performed by a processor, such as a computer or an electronic data processor, in accordance with code, such as computer program code, software, and/or integrated circuits that are coded to perform such functions, unless indicated otherwise.

Figure 1:
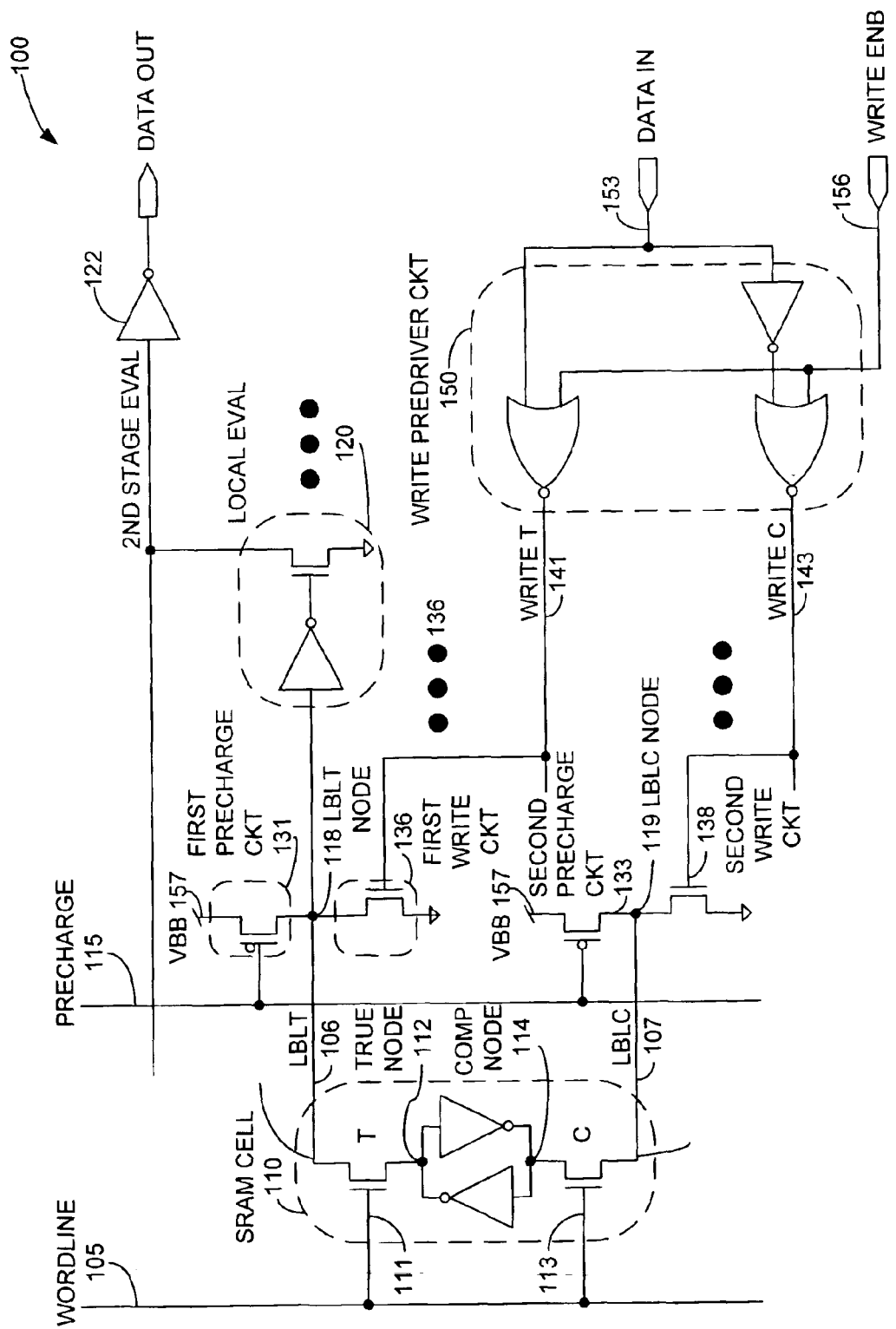
FIG. 1 schematically depicts a conventional SRAM design.

Turning to FIG. 1, disclosed is a prior art SRAM 100 having an SRAM cell 110. The SRAM 100 does not have a continuous BLC. The SRAM cell 100 has a true node 112 and a complementary node 114 coupled to a local true bitline (LBLT) 106 and a local complementary bitline (LBLC) 107, respectively. The SRAM cell 110 is also coupled to a wordline 105 through the gate of a first and second transistor 111, 113.

A precharge line 115 is coupled to a first precharge circuit 131 and a second precharge circuit 133 through their respective gates. In FIG. 1, the first and second precharge circuits 131, 133 use positive field effect transistors (PFETs). As is understood by those of skill in the art, a PFET functions as a short when a low value is applied to its gate, and an open when a high voltage is applied to its gate.

The LBLT 106 is coupled to an LBLT node 118, and the LBLC 107 is coupled to a LBLC node 119. The LBLT node 118 is coupled to the drain of the first precharge circuit 131. The LBLC node 119 is coupled to the drain of the second precharge circuit 133. The source of the precharge circuits 131, 133 are both coupled to a high voltage source 157. The LBLT node 118 is further coupled to a local evaluator 120, which is coupled to a second stage evaluator 122.

Coupled to the LBLT and LBLC nodes 118, 119 are the drains for a first write circuit 136 and a second write circuit 138, respectively. The sources of the write circuits 136, 138 are coupled to ground. In FIG. 1, the first and second write circuits 136, 138 have negative field effect transistors (NFETs). As is understood by those of skill in the art, a NFET functions as an open when a low value is applied to its gate, and a short when a high voltage is applied to its gate.

The gates of the write circuits 136, 138 are coupled to a WriteT line 141 and a WriteC line 143, respectively. The WriteT line 141 and WriteC line 143 are coupled to the respective outputs of a write predriver circuit 150. The write predriver circuit 150 has a data in line 153 and a write enable line 156.

To either read from the SRAM cell 110 or write to the SRAM cell 110, the wordline 105 is asserted from a default logical low state to a logical high state. Furthermore, when reading from the true node 112 of the SRAM cell 110 at the coupled local evaluator 120, the value on the WriteT and WriteC 141, 143 lines are zero. Because the write-lines 141, 143 values are zero, the write circuit 136, 138 are turned off during a read. Therefore, there is an open circuit between the LBL nodes 118, 119 and ground.

Furthermore, when reading from the LBLT line 106 through the local evaluator 120, the precharge line input 115 transitions from a zero to a one, which turns off the precharge circuit 131, thereby opening the connection between the LBLT node 118 and high voltage source (VBB) 157. However, the write circuit 136 is still open, as WriteT 141 is inputting a zero value into the write circuit 136 NFET. Therefore, the voltage on the LBLT node 118 is floating. In floating, an entity, such as the LBLT node 118, is not being driven by an applied voltage. For example, when the WriteT line 141 is on, the LBLT node 118 is driven to ground. However, if the LBLT line 141 is off, the LBLT node 118 is floating, if the precharge circuit 131 is also an open. In FIG. 1, whether the true node 112 is at ground or high is read by the local evaluator 120.

In FIG. 1, during a read, if the true node 112 of the SRAM cell 110 stored voltage value is zero, the floating voltage of the LBLT node 118 discharges to ground into the SRAM cell 110. The resulting ground LBLT node 118 voltage is read by the local evaluator 120. Alternatively, if the true node 112 of the SRAM cell 110 stored voltage value is high, the LBLT node voltage 118 value stays substantially the same as a high voltage. In any event, the LBLT node 118 voltage value is proportional to the voltage of the T node 112 of the SRAM cell 110.

In FIG. 1, during a read, both the WriteT 141 and the WriteC 143 lines are zero, which means that the LBLC node 119 voltage value is floating at the precharge value high voltage value. As complementary voltages are not being applied to both the of the T and C nodes 112, 114 of the SRAM cell at the same time, the values stored in the SRAM cell 110 do not change as a function of being read.

The value of WriteEnb on line 156 is a "one" if not writing to the SRAM cell 110, and a value of a "zero" if a value is being written to the SRAM cell 110. The value of DataIn on line 153 is a "zero" or a "one," as appropriate. If writing, the WriteEnb 156 value is zero. If writing, the wordline 105 value and the precharge 115 value are also raised to a one. Before being driven by the WriteT and WriteC values, a floating voltage is created at both the LBLT 118 and the LBLC 119 nodes.

If writing, the WriteEnb 156 value is zero, which means that the WriteT 141 and the WriteC 143 values will complement one another. Therefore, then the WriteC 143 and WriteT 141 values come to drive the voltages at the LBLT 118 and the LBLC 119 nodes. When either the WriteT 141 or WriteC 143 value is low, the corresponding NFET write circuit 133, 138 stays open, and the corresponding LBL node 118, 119 starts off as a floating high voltage. However, the high floating value of the LBL node voltage discharges to ground when the corresponding NFET write circuit turns on for the non-zero WriteT 141 or WriteC 143 values.

This means that both the LBLT node 118 and the LBLC node 119 become driven complements of one another, and these complementary voltages are then stored in the T and C nodes 112, 114 of the SRAM cell 110, as one value is floating high, but the other one is driven to ground by either write circuit 133, 138 being turned on (that is, going to ground).

This means that the LBLT 106 values and the LBLC 106 values can be written to the SRAM cell 110, as both the WriteT 141 and WriteC 143 lines are complementary, which means that either the write circuit 136 or the write circuit 138 drives the true node 112 or complement node 114 to ground.

Figure 2:
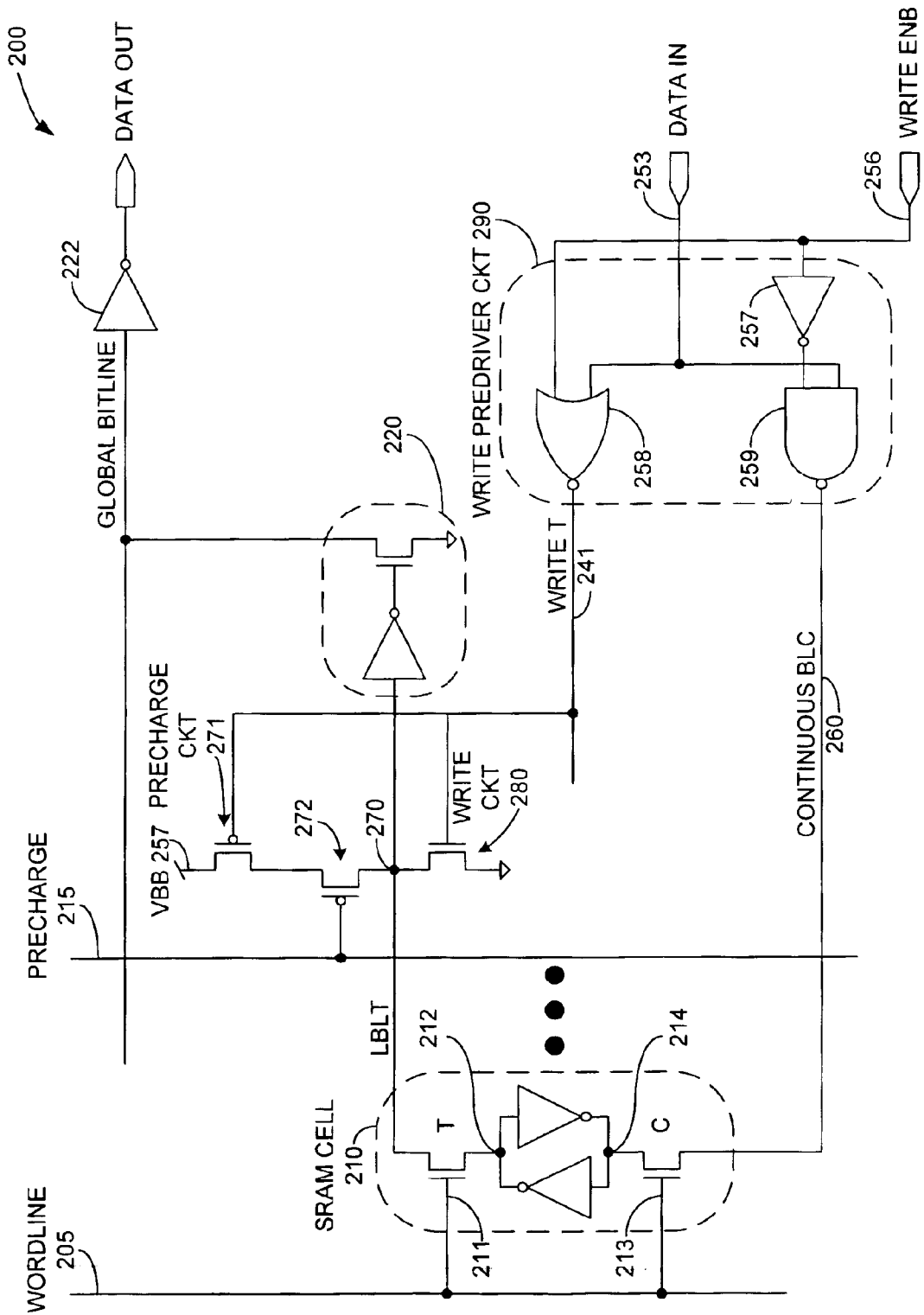
FIG. 2 illustrates an SRAM cell with a continuous bit-line and a simplified configuration of precharge circuits.

Turning now to FIG. 2, disclosed is an SRAM cell system 200 with a continuous bit_line 260 and a simplified configuration of precharge circuits. Generally, SRAM cell 200 allows for the elimination of one of the precharge circuits of FIG. 1. In the system 200, a continuous BLC 260 is coupled to a plurality of SRAM cells 210 (not shown). When attempting a write, all coupled SRAM cells 210 receive the same continuous BLC 260 value. However, through the use of a selected wordline 205, only the selected SRAM cell 210 is written to.

In the SRAM cell 200, the continuous BLC 260 does not have a precharge circuit. In one aspect, a portion of the circuitry and functionality of a precharge circuit 133 can be found in predriver circuit 290 for use with the continuous BLC 260. However, those of skill in the art understand that other logic circuits that have the same functionality as the write predriver circuit 290 can be substituted for the write predriver circuit 290.

In the system 200, a precharge 215 is coupled to a portion of a second precharge circuit 272. The portion of the second precharge circuit 272 can be a PFET. The drain of the second PFET 272 is coupled to the LBLT node 270, and the source of the second PFET 272 is coupled to the drain of the first precharge circuit 271. The WriteT 241 is coupled to the gate of the first precharge circuit 271. The source of the precharge circuit 271 is coupled to a system high voltage (VBB) 257.

In the system 200, whenever a read is occurring, the write_Enb 256 value is one. This is inverted to a zero by a predriver inverter 257. The zero value is input into a predriver NAND 259. Therefore, the value output of the NAND 259, and hence the write predriver circuit 290, is a high voltage, and therefore the continuous BLC 260 is high during a read.

During a read, the WriteT 241 value is low. As the WriteEnb 256 input is a high, this high value is input into the predriver NOR 258, which is output as a low. Therefore, the WriteT 241 output of the write predriver circuit 290 is a low during a read.

During the read of the SRAM 210, the true node 212 of the SRAM cell 210 is read. During the read function, there is a low signal on the WriteT 241 (as a function of the WriteEnb signal 256), so the LBLT node 270 voltage is not connected to ground, as the NFET write circuit 280 is open. Furthermore, the precharge 215 value is transitioned to one, which turns off (opens) the second precharge PFET 272, thereby creating a floating LBLT 270 node.

During a read, the SRAM true node 212, if it has stored within it a low value, will function as a sink for the floating node LBLT 270 value, thereby taking the value of the floating LBLT node 270 to zero, and read by an evaluator 220. In a further emobodiment, a NAND gate is used within the local evaluator 220, instead of an inverter.

The SRAM true node 212, if it has stored within it a high voltage value, drives a high voltage on the LBLT node 270, which is also read by the evaluator 220. In the system 200, the values in the SRAM stored within the true node 212 and the complementary node 214 of the SRAM cell 210 are not changed during a read, because complementary voltages are not being driven on the true node 212 and complementary node 214 simultaneously when wordline 205 is on.

In the system 200, during a read, both the LBLT node 270 and the continuous BLC 260 start out coupled to a high voltage. During a read, the SRAM cell 210 true node 212 and complementary node 214 values do not change.

During the write function, the wordline 205 is turned on, but the precharge 215 is kept at a zero, unlike the transition of the precharge 115 in FIG. 1. During a write, therefore, the second PFET 272 functions as a short between the drain of the first PFET 271 and the write circuit 280. The voltage at the LBLT node 270 is therefore driven either to high source voltage 257 or to ground, as either the first PFET 271 or the write circuit 280 NFET is a short, as a function of the WriteT 241 value. As is also understood by those of skill in the art, although NFETs and PFETs are disclosed in FIG. 2, other NFETs are within the scope of the present invention.

The WriteT 241 value is used to input a high charge or a low charge to the nodes 212 and 214 of the SRAM cell 200, depending upon the polarity of the WriteT function 241, which is in turn a function of the Data In. If the WriteT 241 value is high, the NFET write circuit 280 is turned on. Furthermore, the first PFET 271 is turned off. The LBLT node 270 is therefore drained to zero voltage value, which is written into the true node 212 of the SRAM cell 210. This value is written to the true node 212 of the SRAM cell 210 due to the driving of the high voltage through the continuous BLC 260 and the driving of a grounded voltage at the LBLT 270, as opposed to applying a high voltage through the continuous BLC 260, but floating a voltage at LBLT node 270 during a read.

However, if the WriteT 241 value is zero, the first PFET 271 coupled to the WriteT 241 is turned on (shorts), as zero input turns on the first PFET 271. The NFET write circuit 280, however, is off, and the LBLT node 270 voltage value is driven to the source voltage value 257.

Furthermore, the complementary value of the WriteT 241 is found in the continuous BLC 260. This also occurs during the writing to the SRAM 210. For instance, if the WriteT 241 value is one in a write, the continuous BLC 260 value is zero. Because two complementary voltages are driven into the SRAM T and C nodes 212, 214, the SRAM 210 accepts these complementary voltages and stores them within the SRAM 210.

In the system 200, during a write, the precharge does not transition voltage states from a zero to a one. This can lead to power savings, as power consumption and heat production can be proportional to the frequency of voltage switching. Furthermore, in the system 100, the wordline 105 and the precharge 115 during the write signal all transitioned at approximately the same time, which can create timing difficulties to implement. If the transitions of the precharge 115 and the wordline 105 did not occur at the proper time in the system 100, a short could occur between the high voltage 157 and ground. In the system 200, however, during a write, the PFET 271 and 272 and the NFET 280 are configured so that there will not be a short between the voltage high 257 and the ground during the write at the same time.

It is understood that the present invention can take many forms and embodiments. Accordingly, several variations may be made in the foregoing without departing from the spirit or the scope of the invention. The capabilities outlined herein allow for the possibility of a variety of programming models. This disclosure should not be read as preferring any particular programming model, but is instead directed to the underlying mechanisms on which these programming models can be built.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Many such variations and modifications may be considered desirable by those skilled in the art based upon a review of the foregoing description of preferred embodiments. Accordingly, it is appropriate that the appended claims be construed broadly and in a manner consistent with the scope of the invention.

What is claimed is:

1. A static random access memory (SRAM) cell having a true node and a complement node, comprising:
    a continuous bit_line coupled to the complement node of the SRAM cell;
    a true local bit_line coupled to the true node of the SRAM cell that is at least configured to be driven inversely to the write true bit line;
    a first and second positive field effect transistor (PFET);
    a precharge line coupled to the gate of the first PFET;
    a write true bit_line coupled to the gate of the second PFET; and
    a negative field effect transistor (NFET) coupled to the write true bit_line through the gate of the NFET.

2. The SRAM cell of claim 1, wherein the continuous bit_line is coupled to an output of a NAND gate.

3. The SRAM cell of claim 2, further comprising a write enable input coupled to an input of the NAND gate.

4. The SRAM cell of claim 2, further comprising a data input coupled to an input of the NAND gate.

5. The SRAM cell of claim 1, further comprising an output of a NOR gate coupled to the write true bit_line.

6. The SRAM cell of claim 1, wherein the source of the NFET is coupled to electrical ground.

7. An SRAM cell having a true node and a complement node, comprising:
    a continuous bit line coupled to the complement node of the SRAM cell;
    a true local bit_line coupled to the true node of the SRAM cell;
    a first and second positive field effect transistor (PFET);
    a precharge line coupled to the gate of the first PFET;
    a write true bit line coupled to the gate of the second PFET;
    a negative field effect transistor (NFET) coupled to the write true bit line through the gate of the NFET, wherein the drain of the NFET is coupled to the source of the second PFET.

8. An SRAM cell having a true node and a complement node, comprising:
    a continuous bit_line coupled to the complement node of the SRAM cell;
    a true local bit_line coupled to the true node of the SRAM cell;
    a first and second positive field effect transistor (PFET), wherein the local true bit_line is coupled to the source of the first PFET;
    a precharge line coupled to the gate of the first PFET;
    a write true bit_line coupled to the gate of the second PFET;
    a negative field effect transistor (NFET) coupled to the write true bit_line through the gate of the NFET.

9. A method of reading indicia from an SRAM cell, comprising:
    generating a low value on a write true line;
    generating a high value on a continuous bit_line; and evaluating the true node of the SRAM cell, wherein the true node is inverse of write true signal.

10. The method of claim 9, further comprising transitioning a wordline value from a low value to a high value.

11. The method of claim 9, further comprising conveying indicia from the true node of the SRAM cell to a global bitline.

12. The method of claim 9, further comprising a step of inputting a high value into a write enable line.

13. The method of claim 12, further comprising inverting a signal from the write enable line.

14. A method for writing indicia to a SRAM cell, comprising:

transitioning a write enable signal;

inputting data through a data in line;

generating a write true bit_line signal;

generating a complementary continuous bit_line signal;

driving the true node of the SRAM high if the write true signal is low; and driving the true node of the SRAM low if the write true signal is high.

15. The method of claim 14, further comprising not transitioning a precharge value associated with the precharge line.

16. The method of claim 14, wherein a PFET directly coupled to the precharge line through the gate of the PFET does not transition from on and off.

17. The method of claim 14, wherein the step of driving the true node of the SRAM low further comprises turning on an NFET coupled to the true node and turning off a PFET coupled to the true node.

18. The method of claim 14, wherein the step of driving the true node of the SRAM high further comprises turning on a PFET coupled to the true node and turning off an NFET coupled to the true node.

19. A computer program product for reading indicia from an SRAM cell, the computer program product having a medium with a computer program embodied thereon, the computer program comprising:

computer code for generating a low value on a write true line;

computer code for generating a high value on a continuous bit line; and computer code for evaluating the true node of the SRAM cell, wherein the true node is inverse of a write true signal.

20. A processor for reading indicia from an SRAM cell, the processor including a computer program comprising:

computer code for generating a low value on a write true line;

computer code for generating a high value on a continuous bit_line; and computer code for evaluating the true node of the SRAM cell, wherein the true node is inverse of a write true signal.

* * * * *